United States Patent [19]

Coppola et al.

[11] Patent Number: 5,216,357
[45] Date of Patent: Jun. 1, 1993

[54] REAL TIME SOLID STATE REGISTER HAVING BATTERY BACKUP

[75] Inventors: Richard Coppola, Norcross; Thomas G. Street, Lilburn; Richard L. Riggs, East Point, all of Ga.

[73] Assignee: Schlumberger Industries, Inc., Norcross, Ga.

[21] Appl. No.: 641,385

[22] Filed: Jan. 14, 1991

Related U.S. Application Data

[63] Continuation of Ser. No. 358,494, May 30, 1989, abandoned, which is a continuation of Ser. No. 36,633, Apr. 10, 1987, abandoned.

[51] Int. Cl.⁵ .................. G01R 22/00; G06F 12/16
[52] U.S. Cl. .................. 324/142; 364/483; 365/229
[58] Field of Search .............. 324/142, 103 R, 116; 364/483; 365/228, 229

[56] References Cited

U.S. PATENT DOCUMENTS

| | | | |
|---|---|---|---|
| 4,197,582 | 4/1980 | Johnston et al. | 324/116 X |
| 4,467,434 | 8/1984 | Hurley et al. | 364/483 |
| 4,509,128 | 4/1985 | Coppola et al. | 364/483 |
| 4,594,545 | 6/1986 | Germer | 324/103 R |

Primary Examiner—Stephen M. Baker
Attorney, Agent, or Firm—Sanford J. Asman

[57] ABSTRACT

A microprocessor based time-of-use electricity meter register uses an external real time clock powered by a backup battery during a power outage to measure real time elapsed during the outage. Upon detection of a power outage, line power and real time data are transferred by the microprocessor to an external, non-volatile memory, the external real time clock is energized by the backup battery and the clock reset to accumulate elapsed real time (days, hours, minutes, seconds) during the duration of the outage. Upon resumption of line power, the elapsed real time accumulated by the clock and the content of the non-volatile memory are transferred to the microprocessor, the backup battery is disconnected from the external real time clock and the real time previously stored in the nonvolatile memory is updated by the elapsed real time so that no customer billing data are lost during the outage.

10 Claims, 6 Drawing Sheets

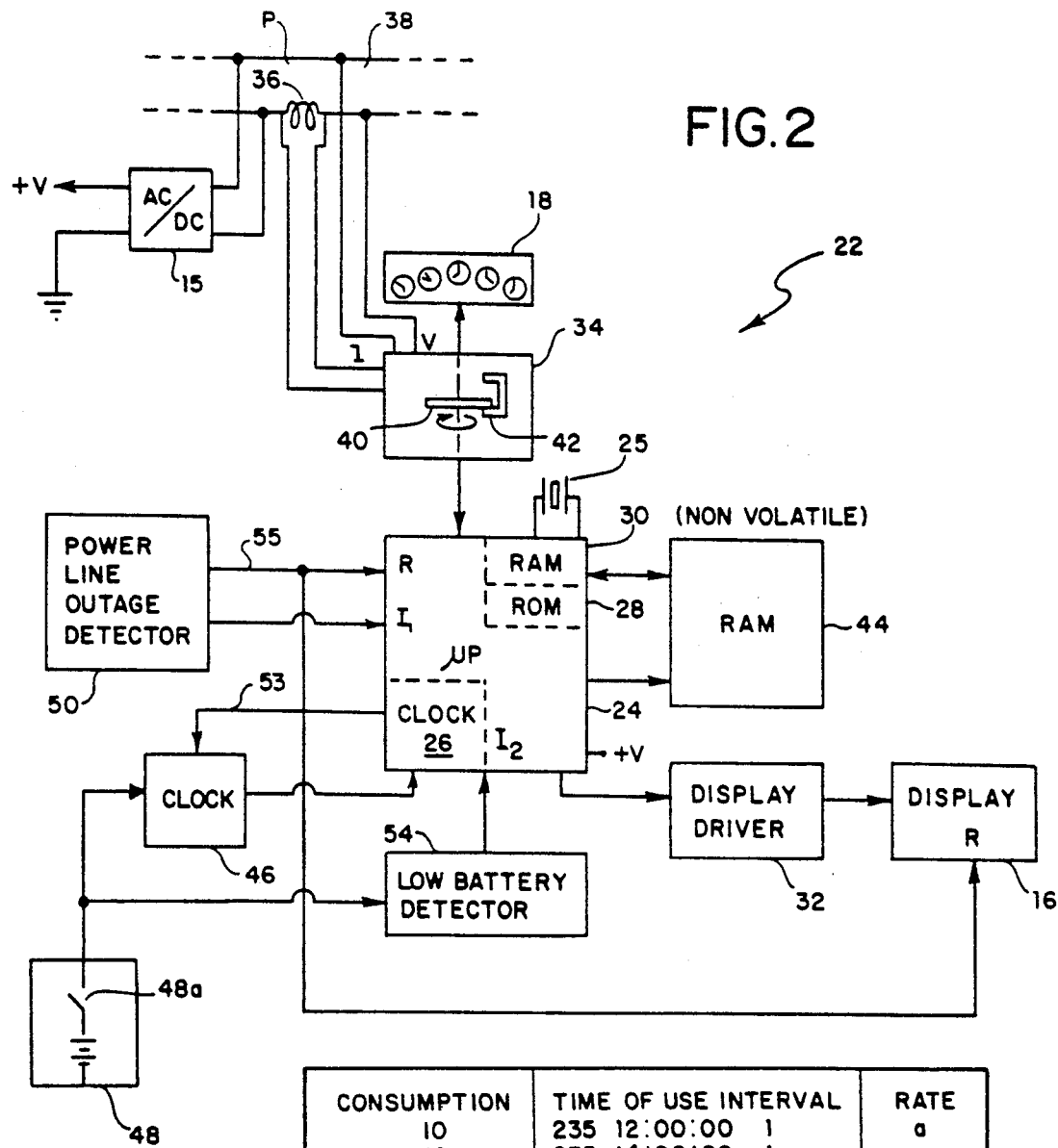

FIG. 7
| TIME OF USE | | REAL TIME CLOCK 46 | |
|---|---|---|---|
| 238 | 12:00:00 | ∅ | |
| 238 | 14:00:00 | ∅ | |
| 238 | 14:00:00 | 0 | |
| 238 | 16:00:00 | 000 | 2:00:00 |
| ⋮ | | 000 | 4:00:00 |
| 238 | 16:00:00 | 012 | 4:00:00 |
| 250 | 20:00:00 | ∅ | |
| 250 | 22:00:00 | ∅ | |
POWER OUT → (row 3)
POWER ON → (rows 4-6, RAM 44)
∅ = DON'T CARE
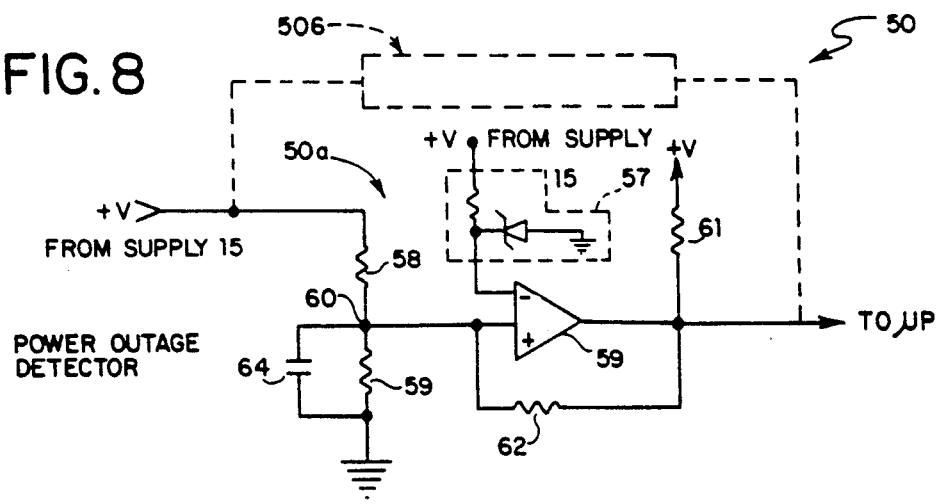
FIG. 8
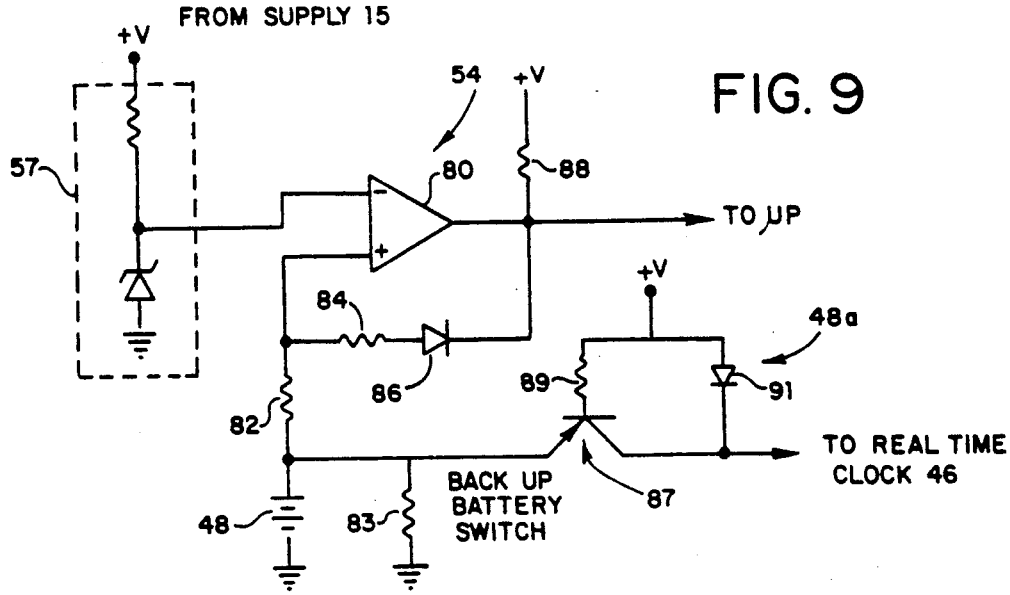
FIG. 9

REAL TIME SOLID STATE REGISTER HAVING BATTERY BACKUP

This is a continuation of copending application Ser. No. 07/358,494 filed on May 30, 1989 now abandoned which was a continuation of Ser. No. 07/036,633 filed on Apr. 10, 1987, now abandoned.

TECHNICAL FIELD

This invention relates generally to solid state time-of-use electricity meter registers for storing electrical energy consumption and corresponding real time data for customer billing, and more particularly, to a solid-state time-of-use electricity meter register having a battery backup energized circuit for preserving real time data while minimizing backup battery current consumption during a line power outage.

BACKGROUND ART

Electricity meter registers monitor line voltage and current as a function of time at each customer site to obtain electrical energy consumption billing data. This generally is carried out by electromechanical watt hour meters that use a disc which rotates as a function of electrical energy consumption and contain registers that display the electrical energy accumulated during a predetermined period of time, e.g., within one billing month. The meters must be read and reset at the end of each month.

More sophisticated electrical energy consumption registers measure both kilowatt hour consumption and kilowatt demand at different billing rates depending upon the "real time" of consumption. "Real time" as used herein refers to time measured in terms of day of week and hours, minutes and seconds of the day. Customer billing rates are determined by the energy supplier in accordance with predetermined time or demand intervals. For example, electrical energy consumption measured during predetermined intervals of peak demand for energy are billed at a highest billing rate, and energy consumption at other predetermined time intervals of the day are billed at correspondingly lower billing rates. This method of metering is known as "time-of-day" or "time-of-use" metering and is commonly carried out in the industry to unify energy consumption throughout the day.

In time-of-use metering apparatus using solid-state circuitry to develop real time-of-use data to be stored in a solid state memory, a microprocessor-based control interrogates the output of the rotating electromechanical disc or line voltage and current measurement sensors to develop line power which is correlated with predetermined real time-of-use intervals to obtain customer billing data. An important requirement of such equipment is to retain the accumulated electrical energy consumption and real time data during a power outage, so that upon resumption of line power, no customer billing data or time data are lost. In this regard, time must continue to be measured during the power outage; otherwise, upon resumption of power, energy consumption will not be properly correlated with time-of-use intervals to develop accurate customer billing data.

An example of a solid-state time-of-use electricity meter register, described in Johnston et al U.S. Pat. No. 4,197,582, has a microprocessor based circuit for interrogating line voltage and current measurement sensors to obtain electrical energy consumption data, and a real time clock in the microprocessor correlates the electrical energy consumption data with predetermined time-of-use intervals, to develop customer billing data. During normal operation of the register, the circuit is powered by a main DC power supply connected to the power lines. Upon a power outage, the line power and real time data accumulated by the internal real time clock are written into an external random access memory that is powered by a backup battery. An external counter, also powered by the backup battery, increments in response to pulses generated at a repetition rate of one pulse per eight seconds during the interval of the line power outage. Upon resumption of line power, the electrical energy consumption and real time data previously stored in the external memory are transferred back to the microprocessor. The count stored in the external counter is transferred to the microprocessor wherein the count is multiplied by the period of the counter (eight seconds), and the result is applied to update the real time read from the external memory. Updating of the real time of the microprocessor by the count stored in the counter is initiated upon the first eight second increment following resumption of line power.

The pulse counting technique used in the Johnston et al patent presents a severe limitation to the maintenance of accurate customer billing data during a power outage, because updating of the real time maintained by the internal clock occurs up to eight seconds after the resumption of line power. Accordingly, among a large number of such meter registers within a region affected by a power outage, there is, on the average, a four second delay following resumption of power before the internal real time clock of each register is updated. Until the internal real time clock is updated, the energy consumed by each customer cannot be billed because there is no association between the energy consumed during the up to eight second delay and its corresponding real time-of-use billing interval. This represents a significant source of inaccuracy because there is substantial electrical power consumption by demand loads immediately upon resumption of power. Loss of energy information associated with each register must be multiplied by the number of registers, e.g. thousands of registers, within a particular distribution system affected by a power outage.

Accordingly, one object of this invention is to provide a method of and system for retaining electrical power and real time data within a time-of-use meter register during power outages.

Another more particular object is to minimize loss of power and time-of-use data during power outages, by updating time-of-use data immediately following power resumption.

A further object is to provide a method of and system for providing a battery backup for a solid-state electricity meter register wherein stored time-of-use data are updated by the elapsed time of the outage immediately upon resumption of line power.

As another disadvantage of the Johnston et al apparatus, because the external memory for storing electrical power and real time data is powered by the back-up battery and is not, itself, non-volatile, current drain from the battery is relatively large, and will maintain the memory non-volatile for only a somewhat limited period of time. Furthermore, in the event that the back-up battery fails or fully discharges during the interval of the power outage, all the energy consumption and real time data previously stored in the memory at the time the outage occurs are lost.

Another object of the invention, therefore, is to provide a battery back-up system in a solid-state time-of-use electricity meter wherein battery current drain is minimized.

A further object is to provide a fail-safe system in the battery back-up circuit of a solid state time-of-use electricity meter register wherein the electrical energy consumption and time-of-use data stored at the time of the power outage are not lost in an event of a back-up battery failure.

Another object is to prevent loss of electrical energy consumption data in a solid-state time-of-use electricity meter register upon a power outage and back-up battery failure.

DISCLOSURE OF INVENTION

An electricity meter register of a type to which the invention is directed comprises power line voltage and current measurement transducers and a processor means having an internal real time clock means for accumulating real time and means for processing line voltage and current measurements to obtain electrical energy consumption data during predetermined customer billing time intervals. The processor means, which is energized by voltage on the power line, contains an internal memory means for storing the electrical energy consumption data and contains means for correlating the stored data to various customer billing rates corresponding to different rate-time intervals during the day established by the electrical energy supplier. To retain the electrical energy consumption and real time during a line power outage, a back-up circuit of the register comprises a non-volatile, external memory means, an external, real time clock means for accumulating elapsed real time from the beginning of a power outage and line power detector means for detecting line power outages and resumptions.

Upon a power outage detected by the detector means, the microprocessor transfers the internal real time clock and power line data stored in the first memory means to the non-volatile, external memory means, and resets the external real time clock means to accumulate real time elapsed from the time of the beginning of the outage. The backup battery is then connected to the external real time clock means under control of the output of the main AC line derived power supply. During a power line resumption, detected by the detector means, the microprocessor reads the real time clock and power line data stored in the external memory means as well as the elapsed real time accumulated by the external real time clock means. The real time read from the external memory means, which corresponds to the time at which the power outage occurred, is updated by the elapsed real time accumulated by the external real time clock means, and normal operation of the electricity meter continues. Preferably, the back-up battery is disconnected from the external real time clock means prior to real time updating to minimize battery current drain.

The detecting means for detecting power line outages and resumptions preferably monitors voltage on the power lines and, in response to a predetermined line voltage corresponding to an early stage of a line power failure, first transfers its stored data to the external memory means, then inhibits the microprocessor from transferring any further data to the external memory. This prevents the external memory from receiving any erratic data as the microprocessor powers down.

In accordance with another aspect of the invention, the state of the back-up battery is periodically monitored to determine whether it has at least a predetermined current supply capacity. If not, the internal real time clock is not updated when line power resumes after a power outage. Electrical energy consumption data thereafter are stored in a totalizing register in the microprocessor, independent of any elapsed time-of-use data, and an alarm indicating that the internal real time clock has not been updated is displayed.

Still other objects and advantages of the present invention will become readily apparent to those skilled in this art from the following detailed description, wherein the preferred embodiment of the invention are shown and described simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 2 is a block diagram of circuitry for carrying out the invention;

FIG. 3 is a table of data accumulated by the microprocessor during operation of the circuit shown in FIG. 2;

FIG. 7 is a table showing the operation of the external and internal real time clocks in FIG. 2;

FIG. 8 is a circuit diagram of the power outage detector of FIG. 2; and

FIG. 9 is a block diagram of the battery back-up switch and low battery detector of FIG. 2.

BEST MODE FOR PRACTICING THE INVENTION

Figure 1:
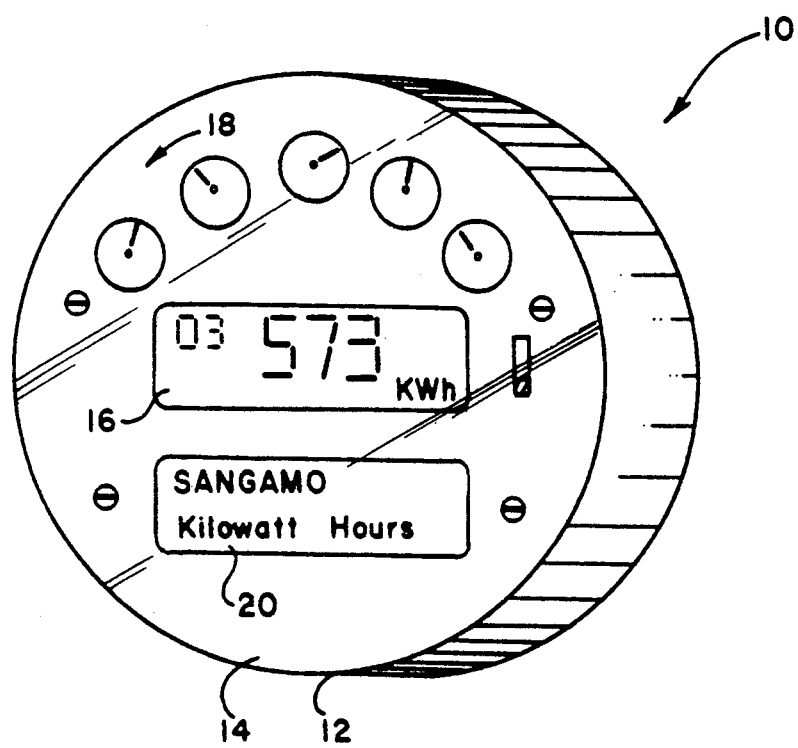
FIG. 1 is a perspective view of a solid-state electricity meter register, in accordance with the invention.

A time-of-use electricity meter register in accordance with the invention, designated as 10 in FIG. 1, is encased within a housing 12 having a plastic cover 14 having clear portions arranged to expose a solid-state display 16. Electromechanical display registers 18 and a name plate 20 are also provided adjacent solid stage display 16. A meter register 10 is located by the electric energy supplier at each customer site to establish the amount of electric energy consumption for customer billing. The register 10 accumulates, among other data, time-of-use data as shown in FIG. 3 wherein electricity usage is correlated with real time in day of year, hours, minutes, seconds format. The usage data consists of both energy readings and demand. At the end of a billing period, for example, at the end of each month, the energy and peak power consumed by the customer is established by obtaining a sum of the quantities used in each time-of-use period. The utility uses the electricity consumption data obtained during an interval multiplied by the billing rate for that interval to arrive at a cost of the energy consumed by the customer.

Thus, energy consumption must be correlated with times of use, to enable the billing rate during each time-of-use interval to be factored to establish the cost of energy to the customer. The meter register 10 accordingly must include a real time clock system for maintaining current time of day, and the clock system must remain operative during as long a period of time as possible. Even during power line outages, the real time clock must continue to operate; otherwise, electricity consumption by the customer and corresponding billing rates intervals will be out of phase with each other, and customer billing will be inaccurate.

This invention is directed toward a method of and system for maintaining current real time in meter register 10 during line power outages so that upon resumption of line power, the real time clock system is immediately updated to account for the time elapsed during the outage, and no billing information is lost.

Thus, referring to FIG. 2, circuitry 22 for operating the meter register 10 comprises a microprocessor 24 whose operation is synchronized by a crystal controlled oscillator 25. Microprocessor 24 includes an internal real time clock 26 whose time keeping is synchronized in a well-known fashion to the power line frequency (e.g. 60 Hz) via a power line clock interface (not shown). Microprocessor 24 also includes a read only memory (ROM) 28 for storing programming to control the microprocessor and its peripheral devices and a random access memory (RAM) 30 for storing energy consumption and demand data, real time data developed by the internal clock 26, and other data. The microprocessor supplies output signals to a display driver 32 that in turn drives display 16 to present alphanumeric characters at the face of the meter register 10, as shown in FIG. 1.

Incorporated with circuitry 22 is a conventional electromagnetic meter movement 34 having a current section 36 and a voltage section 38 connected in a conventional manner to the movement 34 for driving a shaft supported rotating disc 40 at a rotational rate corresponding to the consumption of electricity flowing in power line conductors P at the customer site. The rate of rotation of disc 40 is converted to a digital signal by an optical detector 42 in the meter movement 34, to be supplied to microprocessor 24 as electrical energy consumption data. The shaft of disc 40 is further mechanically coupled to the multidial meter register 18, shown in FIG. 1.

The internal clock 26 maintains real time, to be correlated with energy consumption as time-of-use data so that the proper billing rates corresponding to predetermined billing intervals can be applied to customer billing. As discussed previously, it is important to maintain measurement of real time for prolonged periods, e.g., years, even during intervals of power outage. To this end, provided herein in accordance with the invention is novel circuitry that cooperates with microprocessor 24 to preserve real time measurement during power outages in the meter register 10. The circuitry comprises an external random access memory (RAM) 44, an external real time clock 46, a back-up battery 48, power line outage detector 50 which includes a power-up reset feature, and a low battery detector 54. The term "real time" as applied herein refers to time measured in terms of day of the week and time-of-day, i.e., hours, minutes, seconds. Electricity for powering all components during normal operation of circuit 22 is obtained from a main DC power supply 15 connected to the power lines P.

Upon a power outage on lines P, detected by detector 50, the microprocessor 24 transfers energy consumption and associated real time data from its internal RAM 30 to external RAM 44, which is a non-volatile type memory formed from conventional NMOS or CMOS circuitry. The term "non-volatile" as used herein refers to the property of retaining data in a non-energized state of the memory, that is, with no source of supply voltage applied to the RAM 44. Whenever power line outage detector 50 detects the absence of power on power lines P (e.g. by detecting when the output of AC/DC converter 15 falls below a predetermined threshold) the clock is reset by microprocessor 24 to accumulate real time elapsed from the beginning of the power outage and the battery 48 is then caused to be connected to external real time clock 46. However, if the current capacity of the battery 48, which preferably is a lithium battery having a ten year shelf life and over 360 days of battery carryover, is less than a predetermined capacity, the battery remains connected to the clock 46, but no real time elapsed during the power outage will be accumulated. At this time, RAM 44 stores the electrical energy consumption and associated real time data that existed at the beginning of the power outage.

When there is a resumption of power, detected by detector 50, the battery is disconnected from the external clock, energy consumption and real time data stored in the RAM 44 are read by the microprocessor 24, and the elapsed real time accumulated by clock 46 is read by the microprocessor. The real time read from RAM 44 is updated by the elapsed real time read from clock 46, to obtain an updated real time, and the result is stored in the RAM 30. The real time now retained by the microprocessor 24 and incremented by the internal clock 26 is the current real time for correlating with energy consumption data to obtain customer billing.

This process will become more clear with reference to FIG. 7 having a first column labelled "time-of-use" and a second column labelled "real time clock 46". Each row of FIG. 7 includes a day-of-use entry (e.g., 238 in the first entry) which corresponds to a day of, the year (in this example, the 238th day with respect to a reference date, such as January 1) and a time-of-day entry (e.g., 12:00:00 in the first entry corresponds to noon). Each now additionally includes the content of the external real time clock 46, i.e., the time elapsed from the beginning of an outage.

At the time of a power outage ("power out") in the third row of FIG. 7 (day 238 at 4:00 p.m., in this example), data is transferred from the microprocessor to non-volatile RAM 44 and clock 46 is zeroed by microprocessor 24. The real time clock 46 is then connected to battery 48. This is done by detecting the absence of power on power lines P, by means of power outage detector 50. Thereafter, during the elapsed time of the power outage, the real time clock 46 accumulates elapsed real time (days, hours, minutes, seconds), as shown, until there is a resumption of power ("power on"). Assuming that the time interval of line power outage is twelve days and four hours, in this example, power resumption occurs on day 250 at hour 20 (8:00 p.m.). The internal clock 26 is updated by adding the elapsed real time (twelve days, four hours) to the real time previously stored in RAM 44 (day 238, hour 16). Because the updating occurs immediately upon power resumption, no loss of billing information occurs as is the case in Johnston et al, supra.

Circuitry for carrying out the function of the line power outage detector 50, shown in FIG. 8, comprises first and second threshold detectors 50a, 50b connected to a stable reference source 57 such as a zener diode connected to the main DC supply 15. Each detector 50a, 50b is composed of a differential amplifier 54 having an non-inverting input connected to an unregulated output (+V) of power supply 15 through a resistance voltage divider consisting of resistors 58, 59 and an inverting input connected to the stable reference source 57. A pull-up resistor 61 and a feedback resistor 62 are connected in circuit with the differential amplifier 54 in a conventional manner. A capacitor 64 bypasses to ground any spurious signals at the output of power supply 15.

Figure 4:
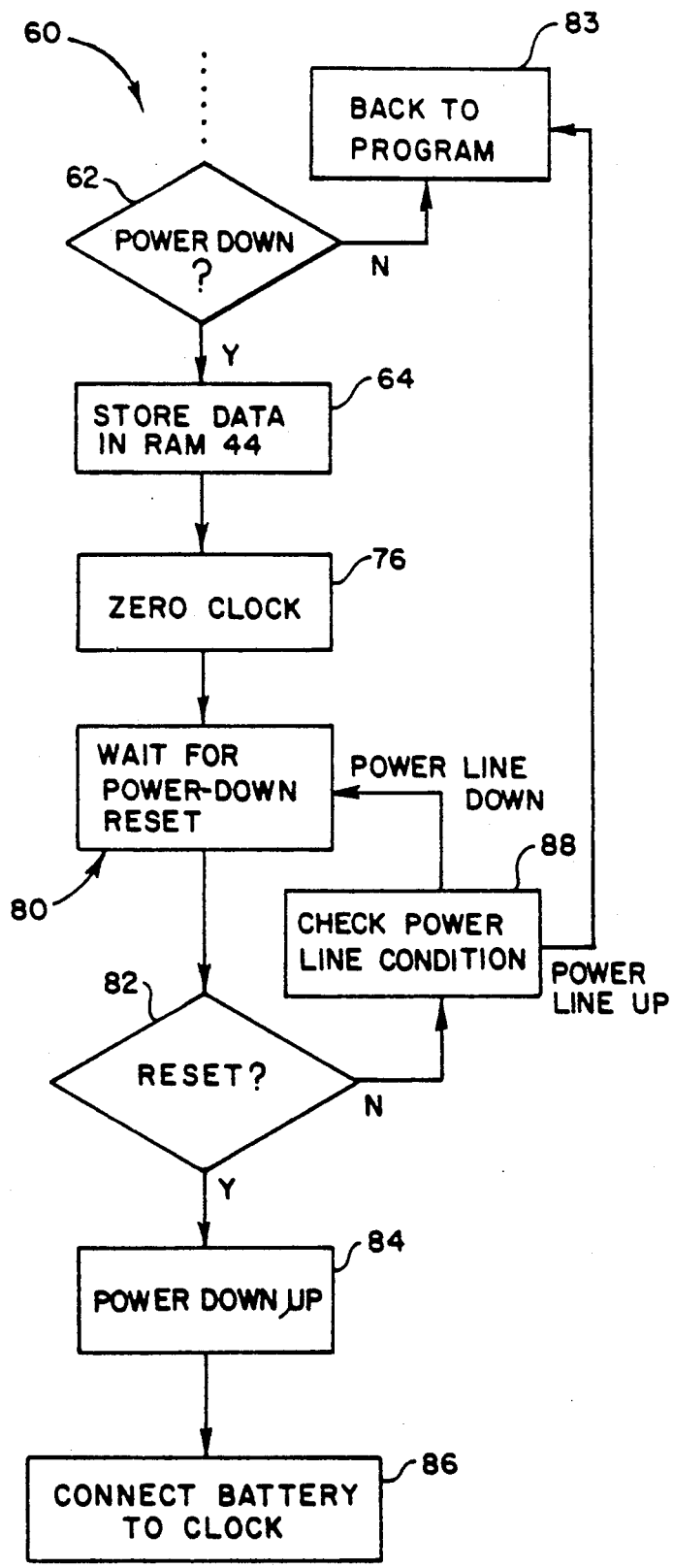
FIG. 4 is a flow chart of programming for controlling the microprocessor of FIG. 2 upon a line power outage.

Detectors 50a and 50b are identical to each other, except that the divider ratios of resistors 58, 59 of the two detectors are unequal and the values of the hysteresis resistors 62 of the two detectors are also unequal. This is to cause the "threshold" of detector 50a to be higher than that of detector 50b, for a reason that shall become clear from the discussion that follows. Assume that the magnitude of output voltage of the power supply 15 is nominally 5.0 volts. Resistors 58 and 59 of both detectors 50a, 50b have relative values such that in the absence of a power outage on power lines P, the magnitude of the voltage at node 60 of each detector is greater than that of the stable reference source 57. Accordingly, the output of each differential amplifier 54 in detector 50a, 50b is at a "high" level, as shown by traces (a) and (b) of FIG. 6. However, during a power outage, as the voltage developed by power supply 15 decays toward ground, node 60 voltage decays correspondingly, as shown in trace (a) of FIG. 6, until the node voltage intersects with the voltage $V_B$ of stable reference source 57 at point p. In response, the output state of the differential amplifier 54 of detector 50a switches to a ground level, as shown by trace (b). The output of detector 50a is applied to an interrup input $I_1$ of the microprocessor 24, and in response, the microprocessor 24 executes a power down routine 60, shown in FIG. 4.

Step 62 of the power down routine 60 detects that a power outage has occurred and a power down sequence is to be carried out. In step 64, electric energy and real time data stored in RAM 30 are transferred to the non-volatile RAM 44.

It is to be noted that the condition of back-up battery 48 is periodically monitored (e.g. once a day). Monitoring the condition of the backup battery 48 is carried out by a low battery detector 54, shown in FIG. 2. The detector 54, shown in more detail in FIG. 9, comprises a differential amplifier 80 having its inverting input connected to a 2.5 volt reference source (e.g. zener diode 57 mentioned above) derived from power supply 15, and its non-inverting input connected, through a resistor 82, to the battery 48. A resistor 83 is connected between resistor 82 and ground to ensure proper operation of comparator 80 if battery 48 is not present. A resistor 84 and diode 86 are connected between the non-inverting input and the output of differential amplifier 80, and a pull-up resistor 88 is connected between the output of the differential amplifier and the supply voltage +V. The output of the differential amplifier 80 is connected to an input port $I_2$ of the microprocessor 24.

When the battery voltage $V_B$ is greater than that supplied by the reference source 57, e.g. 2.5 volts, the magnitude of the voltage at the non-inverting input exceeds that of the inverting input, and the output of the differential amplifier 80 is at a "high" level. In response, microprocessor 24 determines that the current supplying capability of battery 48 is sufficient. On the other hand, if the magnitude of the battery voltage is less than 2.5 volts, the output of the differential amplifier 80 is a "ground" level, and microprocessor 24 determines that the battery 48 has failed, discharged or is not present. In response, a software flag is set (see step 98 of FIG. 5) to be used subsequently to energize an alarm display on display 16. The program now jumps to step 80.

Upon the initial detection of a possible line power outage, accumulated energy and demand data are first transferred from microprocessor 24 to RAM 44 (step 64) and the clock 46 is next zeroed by the microprocessor 24 on line 53 (step 76) to accumulate elapsed real time from the beginning of the outage. Zeroing and data storage takes place between the time of the first onset of power outage and the point when the supply voltage to microprocessor drops below a predetermined level (e.g. from 5.0 volts to 4.5 volts or less).

Figure 6:
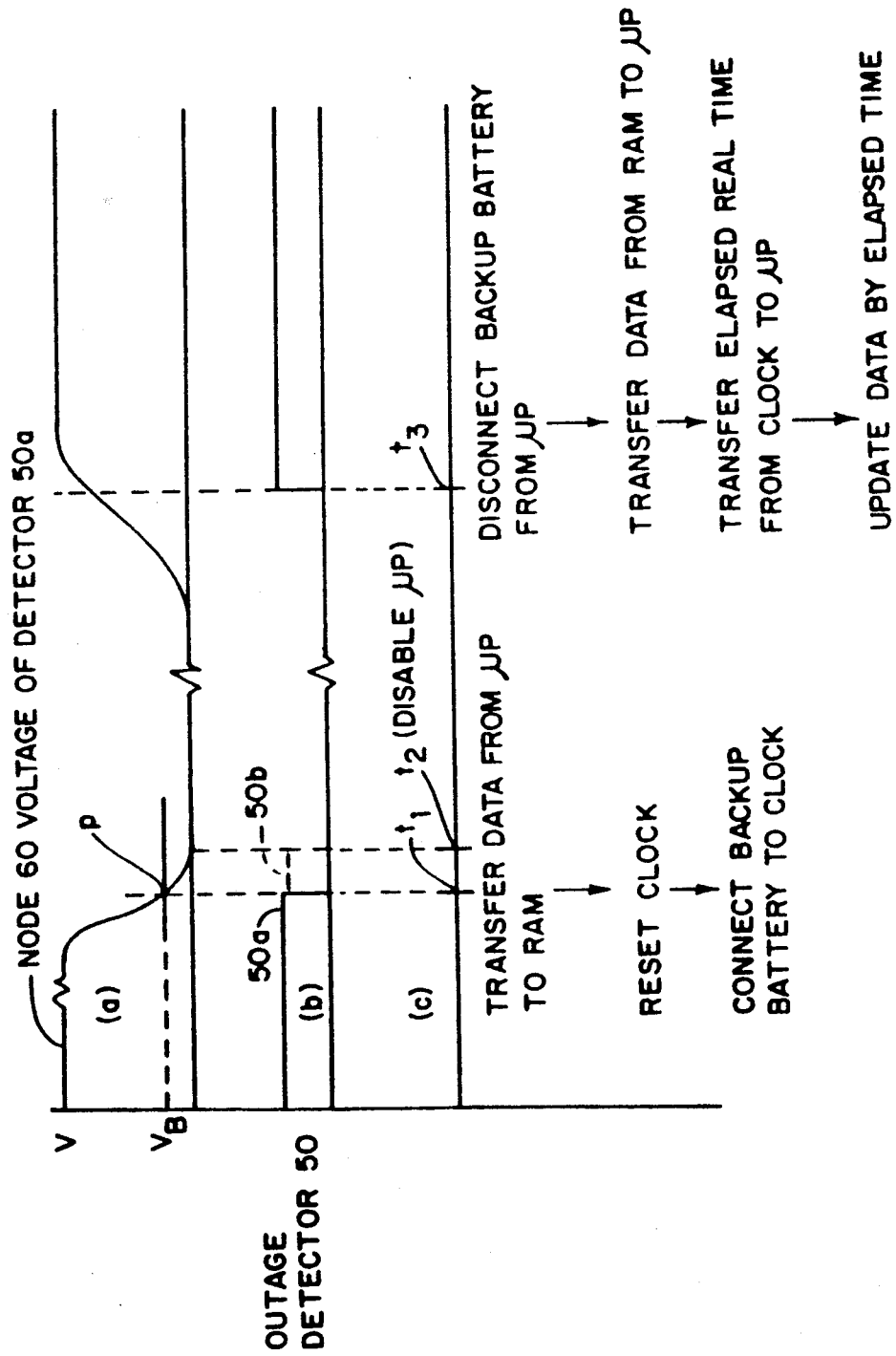
FIG. 6 is a timing diagram showing the operation of the circuit of FIG. 2.

As shown in FIG. 6, as the DC supply voltage +V continues to decay during the outage, beneath the threshold of detector 50a intersecting the lower threshold of detector 50b, the output of threshold detector 50b switches from a "high" state to the ground level as shown in trace (b) of FIG. 6. The program waits for the ground (reset) level (steps 80, 82) at the output of detector 50b, and in response, disables the microprocessor (step 84). The battery 48 is then connected to clock 46 (step 86) via a switch 48a, shown in FIG. 9, comprising a transistor switch 87 having its emitter and collector terminals connected between the backup battery 48 and real time clock 46. The base of the transistor 87 is connected through a resistor 89 to a source 15 of the main supply voltage +V, and a diode 91 is connected between the supply source and collector of the transistor.

When there is no line power outage, the magnitude +V of the main supply source obtained from supply 15 is greater than that of battery 48, and transistor 87 is turned off. Diode 91 is forward biased by supply source +V, and the real time clock 46 is energized by the source +V through the diode 91. Upon a power outage, the voltage +V at source 15 drops to the ground level, transistor 87 is turned on by battery 48 and the clock 46 is powered through the transistor by the battery (step 86). The program is now at time $t_1$, in trace (c) of FIG. 6.

The reset disables the microprocessor as the microprocessor passes through an uncertainty region during power down where proper operation of the microprocessor cannot be guaranteed. Until the microprocessor 24 receives a reset signal from detector 50b, the program recirculates to the main program at step 83 or to step 80 depending upon the output state of the detector 50a (step 88). The register 10 is now operating between times $t_{12}$ and $t_2$ in trace (c) of FIG. 6.

Figure 5:
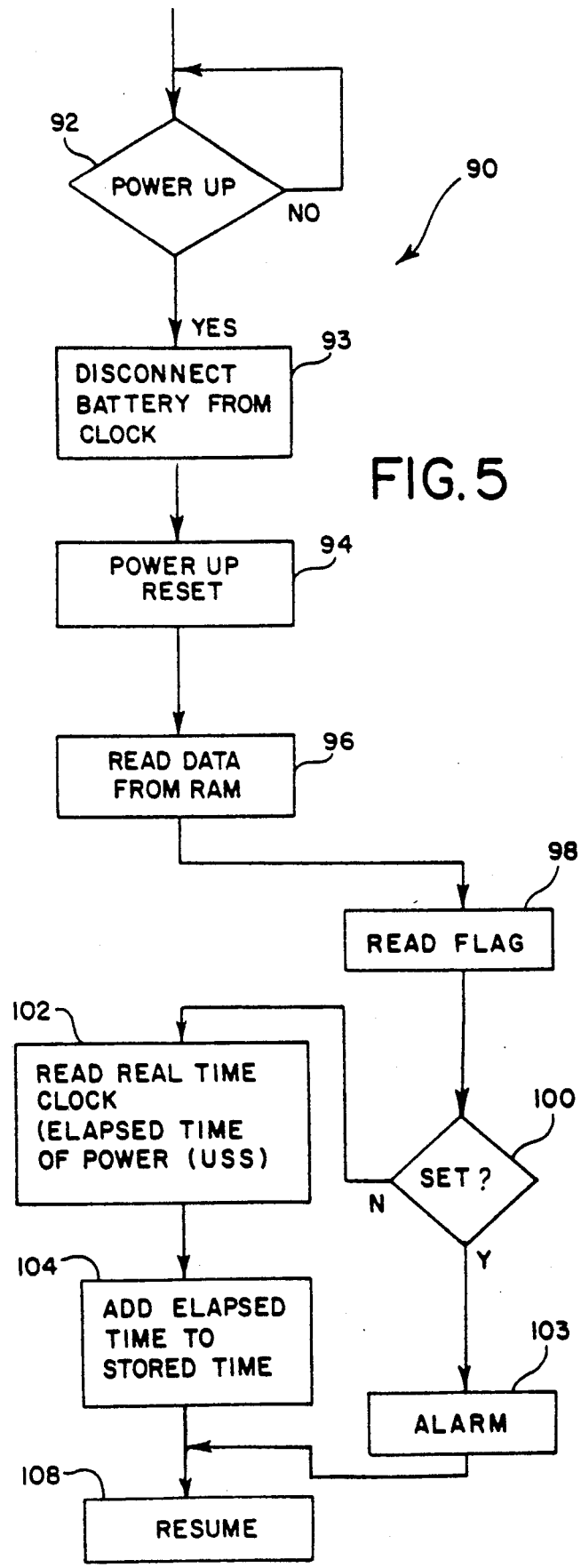
FIG. 5 is a flow chart of programming for controlling the microprocessor 2 upon resumption of line power.

Upon resumption of line power, detected by detector 50b (time $t_3$ in trace (c) of FIG. 6), the power up sequence 90 of FIG. 5 is executed. Step 92 of the power up sequence disconnects battery 48 from clock 46 (step 93). This is done by means of switch 48a which disconnects battery 48 from real time clock 46 as transistor 87 turns off in response to resumption of main supply voltage +V. Detector 50b applies a reset pulse on line 55 to the microprocessor and display reset terminals upon application to the reset circuit of power (step 94) to reset the microprocessor and blank display 16. In step 96, the electrical energy consumption and real time data previously stored in RAM 44 are transferred back to internal RAM 30.

The software flag is now read, in step 98, and if the flag was previously set in step 72 (step 100), an alarm is displayed by display 16 (step 103) to indicate that the real time clock of the register has not been updated. If on the other hand the low battery flag is not set, execution of the program continues to step 102 wherein the real time accumulated by clock 46 is transferred to the accumulator register (not shown) in microprocessor 24, and the real time data stored in RAM 30 is incremented by the elapsed real time (step 104). Time-of-use monitoring of the meter register continues in a normal manner (step 108).

Of particular significance, because the real time stored in RAM 44 is updated immediately following line power resumption, energy consumption can immediately be correlated with time of use to generate customer billing. This is important since demand for electricity is generally very high during the first several seconds of power resumption due to demand equipment. Even if the backup battery has failed, discharged or is absent, the energy consumption and real time data stored in memory 30 at the beginning of the outage are preserved in non-volatile memory 44, whereby, in the worst case, only the real time clock data, and not energy consumption data, are lost during the outage. This is in contrast with the Johnston et al system wherein all data are lost in the event of a power outage and backup battery failure.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein. For example, although the battery backup switch 48a in the embodiment disclosed is a passive switch that responds to the relative magnitudes of the supply and battery voltages, the switch may alternatively be controlled by microprocessor 24.

We claim:

1. An electricity meter for obtaining line voltage and current measurements on a power line, comprising:
   (a) means for making line voltage and line current measurements;
   (b) processor means including a first real time clock means for measuring real time (days, hours, minutes, seconds) and processing said line voltage and current measurements to obtain electrical energy consumption data during predetermined real time intervals, and first memory means for storing said data;
   (c) a power supply for converting line voltage from said power line to an operating voltage to power said processor means;
   (d) a circuit for retaining real time and electrical energy consumption data during a power line outage, said circuit comprising:
   (1) a non-volatile, second memory means, which second memory means does not rely upon a battery for it to be non-volatile;
   (2) a second real time clock means for accumulating elapsed real time (days, hours, minutes, seconds);
   (3) a backup battery;
   (4) line power detector means for detecting line power outages and resumptions, said line power detector means being immediately operable upon the resumption of line power;
   (5) first output means responsive to a line power outage detected by said detector means for (i) transferring real time and electrical energy consumption data stored in the first memory means of said processor means to said second memory means, (ii) connecting said backup battery to energize only said second real time clock means, and (iii) resetting said second real time clock means to enable said second real time clock means to accumulate the total, actual real time (days, hours, minutes, seconds) elapsed from the time of the beginning of the power outage;
   (6) second output means responsive to a line power resumption detected by said detector means for (i) transferring said real time and electrical energy consumption data stored in said second memory means to said processor means, (ii) transferring the elapsed real time accumulated by said second real time clock means to said processor means, and (iii) in said processor means, updating said real time data of said first real time clock means by said elapsed real time;
   (7) battery testing means for testing said backup battery; and
   (8) means responsive to said battery testing means for reading the content of said second real time clock means only if said backup battery has at least a predetermined supply capacity, whereby the updated real time data of said first real time clock means corresponds to the total time of said power outage added to the real time at which said power outage occurred.

2. The meter of claim 1, wherein said detector means includes means for disabling said processor means immediately following transfer of said real time and electrical energy consumption data to said first memory means to prevent transfer of erroneous data to said first memory means as said processor means power down through an uncertainty region of operation thereof.

3. The meter of claim 1, including means for disconnecting said backup battery from said second real time clock means following resumption of line power.

4. The meter of claim 1 wherein said battery testing means includes alarm means for indicating that said backup battery has less than said predetermined supply capacity, said second output means including means for energizing said alarm means.

5. In an electricity meter having means for obtaining line voltage and current measurements on a power line, processor means including a first real time clock means for accumulating real time (days, hours, minutes, seconds) and processing said line voltage and current measurements to obtain line electrical energy consumption data during predetermined time intervals and first memory means for storing said data, and a power supply for converting line voltage from said power line to an operating voltage to power said processor means:
   (a) a circuit for retaining real time and line power data during a power line outage, comprising a second memory means;

(b) a second real time clock means for accumulating elapsed real time (days, hours, minutes, seconds);

(c) a backup battery;

(d) line power detector means for detecting line power outages and resumptions;

(e) first output means responsive to a line power outage detected by said detector means for:
 (1) transferring first real time clock and electrical energy consumption data accumulated by said processor means to said second memory means,
 (2) connecting said backup battery to energize said second real time clock means, and
 (3) resetting said second real time clock means to enable said second real time clock means to accumulate a real time (days, hours, minutes, seconds) elapsed from the time of the beginning of the outage;

(f) second output means responsive to a line power resumption detected by said detector means for:
 (1) transferring said real time clock and electrical energy consumption data stored in said second memory means to said processor means,
 (2) transferring the elapsed real time accumulated by said second real time clock means to said processor means, and
 (3) updating said real time data of said first real time clock means by said elapsed real time;

(g) battery testing means for testing said backup battery; and (h) means responsive to said battery testing means for reading the content of said second real time clock means only if said backup battery has at least a predetermined supply capacity.

6. The meter of claim 5 wherein said battery testing means includes alarm means for indicating that said backup battery has less than said predetermined supply capacity, said second output means including means for energizing said alarm means.

7. The meter of claim 5 wherein said second memory means comprises a non-volatile memory and wherein said first output means includes means for connecting said battery backup to energize only said second real time clock means.

8. The meter of claim 5 including means for disconnecting said battery backup from said second real time clock means following resumption of line power.

9. The meter of claim 5 wherein said detector means includes means responsive to a predetermined voltage on said power line for controlling said first and second output means.

10. The meter of claim 9 wherein said detector means includes means for disabling said processor means immediately following transfer of said real time and electrical energy consumption data to said first memory means to prevent transfer of erroneous data to said first memory means as said processor means power down through an uncertainty region of operation thereof.

* * * * *